United States Patent [19]
Pritchett

[11] Patent Number: 5,847,624
[45] Date of Patent: Dec. 8, 1998

[54] DISCRETE INCREMENT SIGNAL PROCESSING SYSTEM USING PARALLEL BRANCHED N-STATE ATTENUATOR NETWORKS

[75] Inventor: Samuel Dale Pritchett, Flower Mound, Tex.

[73] Assignee: Texas Instruments Incorporated, Dallas, Tex.

[21] Appl. No.: 832,453

[22] Filed: Feb. 7, 1992

Related U.S. Application Data

[62] Division of Ser. No. 378,686, Jul. 11, 1989, Pat. No. 5,136,265.

[51] Int. Cl.$^6$ ............................................. H03H 11/24
[52] U.S. Cl. .......................... 333/81 R; 327/309; 327/317
[58] Field of Search ........................ 333/81 R; 307/540, 307/551, 565; 327/309, 314, 325

[56] References Cited

U.S. PATENT DOCUMENTS

| | | | |
|---|---|---|---|
| 3,015,790 | 1/1962 | Eisaman et al. | 333/81 R |
| 3,453,529 | 7/1969 | Richman | 333/81 R X |
| 4,138,637 | 2/1979 | Weinert | 333/81 R X |
| 4,739,247 | 4/1988 | Cisco et al. | 333/81 R X |
| 4,952,893 | 8/1990 | Cuddy | 333/81 R |
| 4,978,932 | 12/1990 | Crupta et al. | 333/81 R |

FOREIGN PATENT DOCUMENTS 62-209911  2/1988  Japan .

OTHER PUBLICATIONS

Ananasso, Fulvio G.; "A Low Phase Shift Step Attenuator Using P–I–N Diode Switches"; *IEEE Trans on Microwave Theory and Techniques*; vol. MTT–28, No. 7; Jul. 1980; pp. 774–776.

Ebisch, Martin; "A Programmable Precision Decode Attenuator for the Frequency Range up to 200 Mhz"; *Siemens Review*; vol. XXXVII, No. 12; 1970; pp. 615–619; 6 pg in 333/81R.

*Primary Examiner*—Benny Lee
*Attorney, Agent, or Firm*—René E. Grossman; Richard L. Donaldson

[57] ABSTRACT

A discrete increment attenuator for processing an input signal by effecting discrete attenuation increments of the input signal to create corresponding attenuation states for the output signal resulting from the input signal, comprising a parallel branched attenuator network providing at least three attenuation states defining corresponding attenuation increments, coupled to receive the input signal and provide the output signal. A separate attenuation branch circuit having an input end and an output end corresponding to a particular plural parallel branch is selectively activated by an attenuation control signal for effecting a discrete incremental attenuation of the input signal. Control circuitry for each attenuation branch circuit is responsive to an attenuation control signal for selectively activating the associated attenuation branch circuit to effect the incremental attenuation including two active control elements, one on each end of each attenuation branch circuit, the attenuation state control signal biasing the active control elements one of both on to activate the branch circuit and effect the corresponding attenuation or both off to deactivate the branch circuit. Each attenuation branch circuit has two ends, a resistive T-network coupled between the two ends and an RF path which blocks DC bias voltages from the T-network to a source of reference voltage. A bias-off offset circuit is coupled to the input for providing an offset biasing level to the respective two control elements for each inactive branch circuit to inhibit those circuits from activating in response to extraneous signals.

10 Claims, 2 Drawing Sheets

DISCRETE INCREMENT SIGNAL PROCESSING SYSTEM USING PARALLEL BRANCHED N-STATE ATTENUATOR NETWORKS

This application is a Division of application Ser. No. 07/378,686, filed Jul. 11, 1989, now U.S. Pat. No. 5,136,265.

FIELD OF THE INVENTION

This invention relates generally to discrete increment signal processing systems, such as incremental phase shifters and attenuators and more particularly to parallel branched N-state networks and methods for effecting discrete incremental changes in a signal attribute (such as phase or amplitude).

BACKGROUND OF THE INVENTION

Discrete increment signal processing systems process an input signal by effecting discrete incremental changes in a signal attribute (such as phase or amplitude). A conventional configuration for a discrete increment signal processing system (e.g., an incremental phase shift system) includes a cascade of N binary-state processing networks (e.g., phase shift networks), each switchable between two incremental signal attribute states (e.g., incremental phase shift states), such that the discrete increment system processes an input signal to effect one of $2^N$ total signal attribute states (e.g., phase states) for the output signal.

Discrete increment signal processing systems are widely used for such applications as incremental phase shifters or attenuators. In an exemplary discrete increment phase shift system, N binary-state phase shift networks are cascaded to provide $2^N$ phase shift increments. One principal application for radio frequency (RF) phase shift systems is in electronically controlled phased array radar systems.

Phased array radar systems use an antenna that does not require any mechanical movement for beam steering, allowing a complete antenna scan in several hundred nanoseconds. Thus, a phased array system using an electronically steered beam is advantageous for most antenna steering applications, provided that it can be made comparable to the mechanically steered alternative in terms of cost, reliability, bandwidth, signal-to-noise ratio, dynamic range, insertion loss (signal power attenuation) and the third order intercept point.

Electronic phased array radars use phase shift systems to generate multiple phase-shifted RF signals that combine (interfere) to produce a directed beam that can be scanned by controlling the phase shift system. A discrete increment, solid state implementation of an RF phase shift system is generally preferred since large phased arrays are normally steered by a digital computer.

Discrete increment phase shift systems conventionally use cascaded binary-state phase shift networks. Binary-state phase shift networks are of two major types—loaded-line and switched-line (reflective phase shift networks are assumed to be a subset of switched-line phase shift networks). Due to phase accuracy, low inherent insertion loss and low insertion loss variations at small phase increments, loaded-line networks are generally preferred for the least significant binary phase digits or phase bits (i.e., small phase increments). Switched-line networks are preferred for the most significant phase bits (i.e., large phase increments) because loaded line networks exhibit relatively larger phase errors and insertion loss variations at the larger phase increments. Thus, a conventional five-bit phase shift system will include a loaded-line phase shift network as the least significant bit (and possibly the next least significant bits) and switched-line networks for the other phase bits.

One significant problem with switched-line phase shift networks is that significant insertion loss is inherent because active devices are used as control elements for the parallel branched lines (phase increment circuits). Thus, significant additional gain is required by the channel amplifier chain to overcome the insertion loss of the phase shift network and maintain overall channel gain. As a result, reducing phase shifter insertion loss is critical to phased array systems, particularly those using switched-line phase shift networks.

Reducing phase shifter insertion loss for both the receive and transmit channels requires additional gain stages, improved-noise-figure low noise amplifiers, additional parts count and increased power consumption, and causes reduced module efficiencies. Each of these factors directly affects feasibility, producibility and cost of phased array systems.

Present monolithic X-Band five-Bit (binary-state) switched-line phase shift systems using ion-implanted field effect transistors as the branch control elements exhibit approximately 7 dB insertion loss. Corresponding phase shifters using PIN diode control elements exhibit approximately 4 dB insertion loss.

Accordingly, a need exists in general for a more flexible design approach to discrete increment signal processing systems, and in particular for a phase shift network with reduced insertion loss over that currently available using only binary-state networks (switched-line and/or loaded-line).

SUMMARY OF THE INVENTION

The present invention increases design flexibility for discrete increment signal processing systems, such as incremental phase shifters and attenuators, which effect discrete incremental changes in a specified signal attribute of an input signal (such as phase, amplitude or time delay), by using parallel branched, N-state signal processing networks, with design optimization being achieved by implementing a system with a selected number of parallel branched processing networks each with a selected number of incremental signal attribute states (without being restricted to binary-state networks).

In one aspect, the discrete increment signal processing system of this invention processes an input signal to effect a selected incremental signal attribute change and achieve a corresponding output signal attribute state. The system includes at least one parallel branched signal processing network with at least three incremental signal attribute states each implemented by a discrete increment branch circuit. Each discrete increment branch circuit can be selectively activated to effect a corresponding incremental signal attribute change in the input signal, thereby achieving the corresponding output signal attribute state.

Typically, a system will include multiple parallel branched processing networks. A selected branch circuit from each processing network is activated to effect a combined incremental signal attribute change, providing a combined output signal attribute state.

In its more specific aspects, the discrete increment signal processing system can be used to implement a phase shift system. For the phase shift application, the system includes multiple parallel branched phase shift networks, each of which includes, three or more phase-increment branch circuits (i.e., ternary or higher state networks)—for binary-state phase shift networks included in the system, phase-increment loaded line (rather than branched) circuits are recommended to reduce insertion loss. The cascaded networks provide a predetermined number of phase shift increments (phase states).

For a preferred embodiment, each phase-increment branch circuit includes one PIN diode control element on either end of a transmission line segment formed by resistive and reactive components configured to produce a predetermined phase shift increment. A control circuit selectively activates the branch circuit by biasing, the PIN diodes on, coupling the input RF signal through the transmission line segment to effect the desired incremental phase shift.

The configuration of the phase shift system is determined by various design considerations including achieving a specified phase resolution (i.e., maximum phase error) while minimizing insertion loss, insertion loss variations and controlling VSWR. Significant reduction in insertion loss is achieved by using phase shift networks with three or more parallel phase-increment states in place of a necessarily greater number of binary-state networks, thereby reducing the number of cascaded phase shift networks. Typically, phase shift networks with three or more states will be implemented with switched-line phase-increment branch circuits, while binary-state networks will be implemented with loaded-line circuits.

In an exemplary embodiment, a 32-state phase shift system (32 total phase shift increments) is implemented using three cascaded phase shift networks—two quaternary-state (Quit) networks and one binary-state (Bit) network. A most significant Quit includes four switched-line phase-increment branch circuits that provide four phase shift increments: Reference, +90°, −180° and −90°. A least significant Quit also includes four switched-line phase-increment branch circuits that provide four additional phase shift increments: Reference, −22.5°, −45° and −67.5°. A least significant Bit is a phase-increment loaded-line circuit that provides the final phase shift increment of 11.25°.

The technical advantages of the discrete increment signal processing system and method of this invention include the following. Using parallel branched N-state incremental signal processing networks provides added flexibility in designing improved discrete increment signal processing systems. System design is not limited to the use of cascaded binary-state networks. The parallel branched N-state design approach is applicable to discrete increment systems in general, including phase shifters and attenuators. Insertion loss (signal power attenuation) can be minimized by reducing the number of cascaded networks that would be required by a binary-state-only system, thereby reducing system complexity. For example, phase shift systems can be designed using phase shift networks with three or more phase increment states (branches), allowing system design to achieve low insertion loss and good VSWR performance, as well as reduced complexity.

BRIEF DESCRIPTION OF THE DRAWING

For a more complete understanding of the present invention and for its further advantages, reference is now made to the following Detailed Description, taken in conjunction with the accompanying Drawings, in which.

DETAILED DESCRIPTION

The Detailed Description of the parallel branched N-state method of this invention to designing discrete increment signal processing systems is in connection with an exemplary phase shift system embodiment. An alternative exemplary embodiment of an attenuator system is also described. This parallel branched N-state design method has general applicability to designing discrete increment signal processing systems which can be readily implemented in accordance with this detailed description by those skilled in the art to obtain the advantages of this invention.

The Detailed Description of the parallel branched N-state design method for discrete increment signal processing systems, and the exemplary discrete increment phase shift and attenuator systems, is organized as follows:

1. Parallel Branched N-state Design
2. Phase Shift System
3. Attenuator System
4. Conclusion 1. Parallel Branched N-state Design. The parallel branched N-state method of this invention for designing discrete increment signal processing systems uses cascaded parallel branched incremental processing networks, each with N states, rather than being limited to binary-state networks.

Conventional binary-state parallel branched networks are a logical subset of the generalized parallel branched N-state technique of this invention. The binary-state network comprises two states (n=2), and is commonly called a bit (binary digit).

The generalized parallel branched N-state design method is described with reference to FIG. 1, and in connection with exemplary discrete increment phase shift systems.

The entire polar plane is divided into 360° or 2π radians of arc. A general N-state phase shift element divides a given phasor, $\psi_i$, into $n_i$ equal increments. The number of equal increments, $n_i$, is designated the "degree" of the phase shift element. The phasor (or phase shift) increment of the phase shift element, $\phi_i$, is simply the phasor, $\psi_i$, divided by the degree of the phase shift element, $n_i$, such that $$\phi_i = \frac{\psi_i}{n_i} \quad (1)$$

Figure 1:
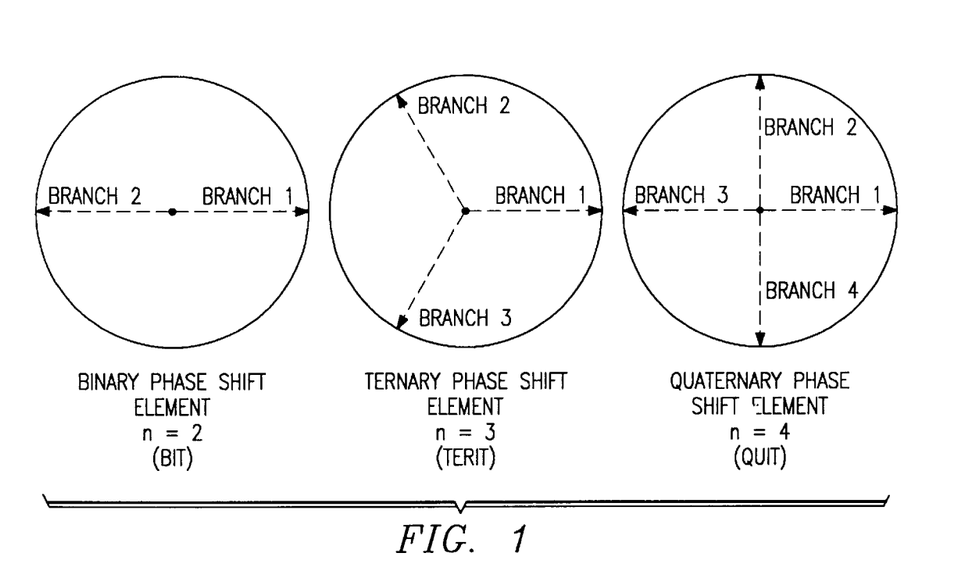
FIG. 1 shows three phasor diagrams for, respectively, binary, ternary and quaternary state systems.

The phasor increments for phase shift elements with degrees n=2, n=3, and n=4 are illustrated in FIG. 1.

For a parallel branched N-state phase shift system, multiple phase shift networks, each with a selected degree and phasor increment, are cascaded to achieve smaller overall phasor increments while minimizing the complexity of the overall phase shifter. For such a general cascaded N-state phase shift network, the relationship between the phasor, $\psi$, and the phasor increment, $\phi$, is described by $$\psi_i = \phi_{i-1} \quad (2)$$

where $\phi_1$ corresponds to the most significant phasor increment, typically $\psi_1$=360°.

A conventional binary-state example of this is a three element binary (3-bit) phase shifter, in which a 0°/180° element is cascaded with a 0°/90° element and a 0°/45° element to achieve an overall phasor increment, $\phi_T$ of 45°

(i.e., eight phase shift increments of 45° each). The 0°/180° element is called the most significant phase bit with $\psi_1=360°$ and $\phi_1=180°$. Similarly the 0°/90° element is the second most significant phase bit with $\psi_2=180°$ and $\phi_2=90°$, while the 0°/45° element is the least significant phase bit with $\psi_3=90°$ and $\phi_3=45°$.

In a phase shift system using cascaded phase shift networks of similar degree, the total number $N_T$ of phase states or phase shift increments in the entire phase shifter is described by the relationship $$N_T = n^m \tag{3}$$

where "m" is the number of phase shift networks of similar degree in the phase shifter. In the previous 3-bit phase shifter example, n=2 and m=3 such that $$N_T = 2^3 = 8 \tag{4}$$

For the generalized phase shift system with cascading elements of mixed degrees, relationship (3) describing the total number of phase states or phase shift increments in terms of the number and degree of the constituent phase shift networks becomes $$N_T = \prod_{i=2}^{\infty} (n_i^{m_i}) \tag{5}$$

where $n_i$ is a phase shift network of degree "i" and $m_i$ is the total number of phase shift networks of degree "i". Using the relationships (1) and (5), the overall phasor increment, or phasor resolution, of a cascaded phase shift circuit with elements of mixed degrees is $$\phi_T = \frac{360°}{\prod_{i=2}^{\infty}(n_i^{m_i})} \tag{6}$$

or $$\prod_{i=2}^{\infty}(n_i^{m_i}) = \frac{360°}{\phi_T} \tag{7}$$

Phase shift system applications always include the specification of a maximum phasor error. This maximum phasor error is translated into a minimum phase resolution requirement, $\phi_{Minimum}$, to achieve the imaging, nulling and sidelobe goals of the application. This phase resolution criteria can also be expressed by the following inequality $$\phi_T \leq \phi_{Minimum} \tag{8}$$

Substituting (8) into (7) yields $$\prod_{i=2}^{\infty}(n_i^{m_i}) \geq \frac{360°}{\phi_{Minimum}} \tag{9}$$

In accordance with the N-state design method of this invention, different combinations of parallel branched phase shift networks of mixed degrees can be used to achieve the same overall phasor increment or phasor resolution. The number of possible combinations increases significantly as the required phasor resolution becomes smaller and smaller.

A configuration design example illustrates the foregoing relationships, and the parallel branched N-state design method of this invention. In this example, a minimum 7.5° phasor resolution is specified. Substituting this into (9) yields $$\prod_{i=2}^{\infty}(n_i^{m_i}) \geq \frac{360°}{7.5°} = 48 \tag{10}$$

Three possible configurations are compared, designated phase shift circuits A, B, and C. For Circuit-A, a conventional approach uses only binary-state (n=2) phase shift networks. For Circuit-B, a mixed degree configuration using both binary (n=2) and quaternary (n=4) phase shift networks will be used. Finally for Circuit-C, the phase shifter uses binary (n=2), ternary (n=3) and quaternary (n=4) phase shift networks. Ternary-state networks are designated Terits, while quaternary-state networks are designated Quits.

For Circuit-A, relationship (10) reduces to $$(2)^{m_2} \times (3)^0 \times (4)^0 \times (5)^0 \times (6)^0 \times (7)^0 \times \ldots \geq 48 \tag{11}$$

or $$(2)^{m_2} \geq 48 \tag{12}$$

Solving (12) for $m_2$, the number of binary-state phase shift networks (or Bits) yields $$m_2 \geq \frac{\log 48}{\log 2} \tag{13}$$

or $$m_2 \geq 5.585 \tag{14}$$

(the number of phase shift networks)

Since m must be an integer $$m_2 = 6 \tag{15}$$

Hence, Circuit-A must be a 6-Bit phase shifter to achieve the desired phase resolution. Incidentally, by substituting the appropriate values into (5) and (6), the exact values for $N_T$ and $\phi_T$ are $N_T=64$ and $\phi_T=5.6250°$.

Minimizing the total number of phase shift networks $\Sigma m_i$, in a phase shift system using phase shift networks of mixed degree involves routine design tradeoffs between insertion loss and the choice of phase shift networks.

For Circuit-B, the relationship in (10) reduces to $$(2)^{m_2} \times (3)^0 \times (4)^{m_4} \times (5)^0 \times (6)^0 \times (7)^0 \times \ldots \geq 48 \tag{16}$$

or $$(2)^{m_2} \times (4)^{m_4} \geq 48 \tag{17}$$

Where $M_2$ is a binary-state phase shift network (Bit) and $M_4$ is a quaternary state network (Quit). Logarithmic manipulation yields $$m_2 + 2m_4 \geq \frac{\log 48}{\log 2} \tag{18}$$

or $$m_2 + 2m_4 \geq 5.585 \tag{19}$$

Minimization of the total number of phase shift networks, $\Sigma m_i$, in the overall phase shift system can be achieved by selecting either (a) $m_2=1$ and $m_4=3$ (1-Bit, 3-Quit, or (b) $m_2=2$ and $m_4=2$(2-Bit, 2-Quit). Because binary loaded-line phase shift networks demonstrate less loss than binary switched-line networks, of the two choices for Circuit-B, a phase shift system using two binary (loaded-line) networks and two quaternary (switched-line) networks provides the smallest insertion loss.

The Circuit-B phase shifter is designated a 2-Bit, 2-Quit phase shifter. Incidentally, by substituting the appropriate values into (5) and (6) the exact values for $N_T$ and $\phi_T$ are $N_T$=64 and $\phi_T$=5.625°.

In Circuit-C the relationship in (10) reduces to $$(2)^{m_2} \times (3)^{m_3} \times (4)^{m_4} \times (5)^{o} \times (6)^{o} \times (7)^{o} \times \ldots \geq 48 \qquad (20)$$

or $$(2)^{m_2} \times (3)^{m_3} \times (4)^{m_4} \geq 48 \qquad (21)$$

Where $M_2$ is a Bit, $M_3$ is a Terit and $M_4$ is a Quit. Logorithmic manipulation yields $$m_2 + \frac{\log 3}{\log 2} m_3 + 2m_4 = m_2 + 1.585 m_3 + 2m_4 \geq \frac{\log 48}{\log 2} \geq 5.585 \qquad (22)$$

Minimizing the total number of phase shift networks, $\Sigma m_i$, is achieved by selecting either (a) $m_{2\_}1$, $m_3$=1 and $m_4$=2, (b) $m_2$=1, $m_3$=2 and $m_4$=1, or (c) $m_2$=2, $m_3$=1 and $m_4$=1. Using an approach similar to that for Circuit-B, a phase shift circuit using two binary (loaded-line) elements, a single (switched-line) ternary element and a single (switched-line) quaternary element provides the smallest insertion loss. This phase shifter is designated a 2-Bit, single-Terit, single-Quit phase shifter.

In Circuits A and B the exact values for $N_T$ and $\phi_T$ were $N_T$=64 and $\phi_T$=5.625°. Substitution of the appropriate values into (5) and (6) for Circuit-C the exact values of $N_T$ and $\phi_T$ are $N_T$=48 and $\phi_T$=75°. Therefore the minimum number of states for the desired phasor resolution is obtained in Circuit-C. As a result, the complexity of Circuit-C is slightly less than the complexities of Circuits A and B.

A well known problem inherent to all discrete state phase shifters is increased insertion loss and phase errors due to undesired VSWR (Voltage Standing Wave Ratio) interactions between the constituent phase shift networks. Minimizing the number of cascaded phase shift networks also minimizes the loss and phase errors associated with these undesired VSWR interactions between the constituent networks. Both Circuits B and C in the example have a total of four phase shift networks while Circuit-A, the conventional all binary-state approach, has six. Accordingly, insertion losses introduced by VSWR interactions are minimized in Circuits B and C.

In addition, some control elements consume considerable DC power when biased in an on (or active) state (i.e., PIN diodes). Consequently when these devices are used, minimizing the total number of phase shift networks also minimizes DC power consumed - Hence both Circuits B and C consume less DC power than Circuit-A when power-consuming control elements (such as PIN diodes) are used.

In most switched-line parallel branched phase shift networks, a minimum of two control elements are required on each branch circuit of the network. Consequently, the total number of cascaded branch circuits in a phase shift system (i.e., all networks) should be minimized. Reduction of the total number of phase shift networks again results in reduced insertion loss.

An additional improvement in phase shifter performance obtainable from the N-state parallel branched design method of this invention is the avoidance of undesired resonances. In conventional binary-state phase shift systems 180° and 90° bits are required. Undesired resonances within these structures can occur. These undesired resonances can be avoided by using a Terit as the most significant phase shift element, providing 0°, 120° and 240° phase states that eliminate the undesired $\lambda/2$ and $\lambda$ resonances.

For the exemplary 32-phase-state phase shift system described in Section 2, a comparison of insertion loss performance indicates that a conventional 5-Bit phase shifter can achieve 4 dB total insertion loss, while a 2-Quit, single Bit phase shifter can achieve 2 dB total insertion loss using identical control elements.

A limit to the usefulness of parallel branched N-state phase shift networks is capacitive input and output loading by the parallel combination of all the inactive (off-state) branch circuits (i.e., control elements) of a network. Once the effective capacitive loading of the control elements becomes significant, additional parallelization will not improve performance. In most narrowband and some broadband applications this limit can be extended by using distributed techniques to effectively remove the capacitive loading effect.

Figure 2:
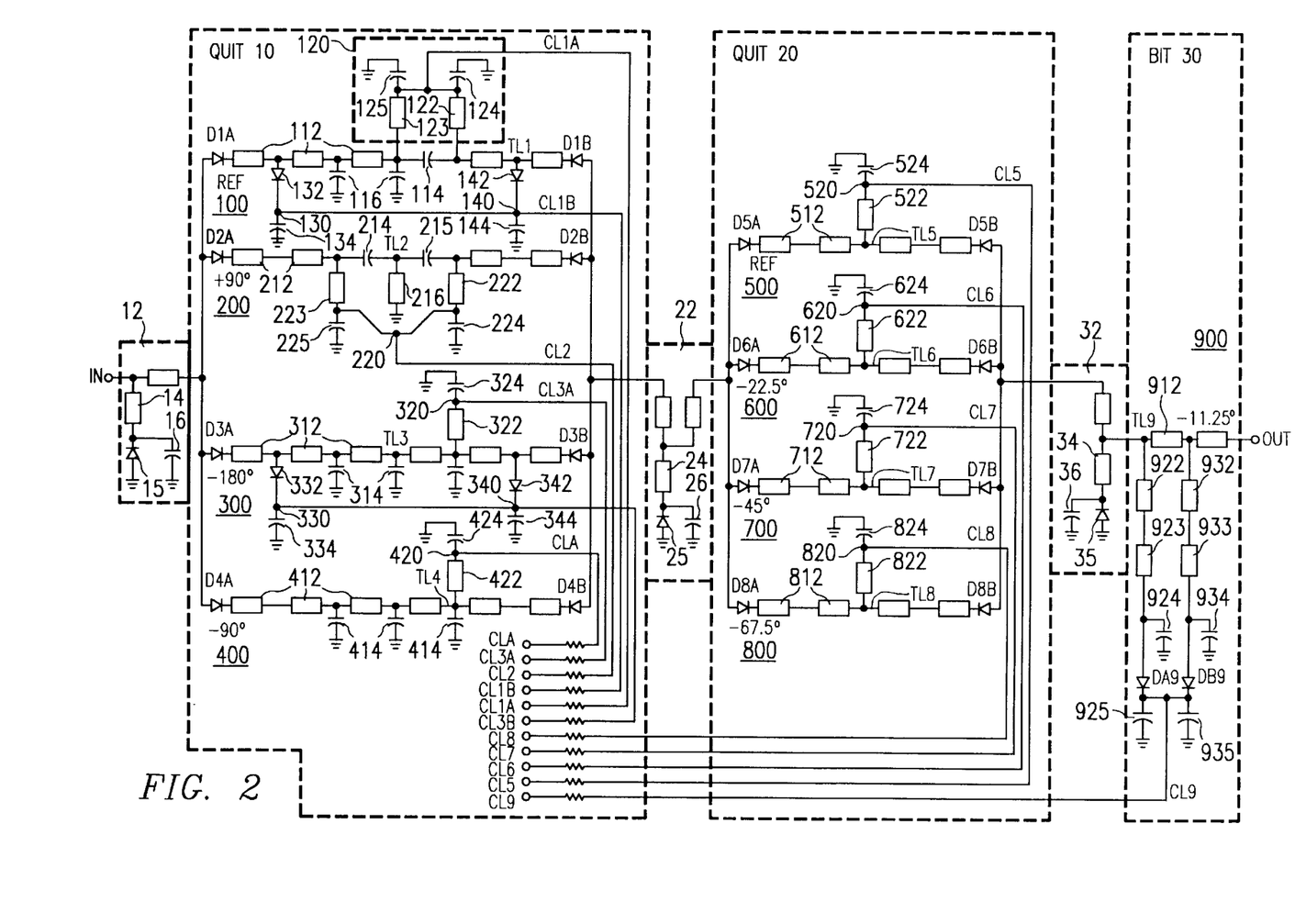
FIG. 2 is a circuit schematic diagram of a 32-phase state bit PIN diode phase shift system configured in accordance with this invention as a 2-Quit, 1-Bit phase shift system with two Quit parallel branched phase shift networks and one Bit phase shift network.

2.0. Phase Shift System. As an exemplary embodiment of a discrete increment signal processing system designed using the parallel branched N-state design method of this invention, a 2-Quit, single-Bit phase shift system is shown in FIG. 2. The exemplary phase shift system is a 32-state phase shifter using PIN diodes as control elements.

For the exemplary embodiment of a 32-state phase shift system using 2-Quit and 1-Bit phase shift networks, equation (5) becomes:

$$N_T = \prod_{i=2}^{\infty} (n_i^{m_i}) = 2^1 \times 4^2 = 32 \qquad (5)$$

Thus, the exemplary phase shift system provides 32 phase states using a total of three phase shift networks. By comparison, the total number of phase shift networks required for a conventional binary-state network implementation of a 32-phase-state system is obtained by solving equation (3) for m:

$$m = \frac{\log N_T}{\log n} = \frac{\log 32}{\log 2} = 5$$

for a total of five phase shift networks.

A phase shifter with 32 phase states divides the most significant phasor increment of 360° into 32 equal phase states or increments of 11.25°. For the 2-Quit, single-Bit phase shifter, the most significant Quit provides four phase shift increments: Reference, +90°, −180° and −90°. The least significant Quit provides four additional phase shift increments for each of the phase increments of the most significant Quit (i.e., for the 90° phasor): Reference, −22.5°, −45° and −67.5°. Finally, the least significant Bit provides the final two phase states or increments by selectively introducing a 11.25° phase shift.

As shown in FIG. 2, the exemplary 2-Quit, single-Bit phase shift system includes three cascaded phase shift networks—a most significant Quit 10, a least significant Quit 20 and a least significant Bit 30. Quits 10 and 20 are switched-line, parallel branched quaternary-state phase shift elements. Bit 30 is a loaded line binary-state phase shift element using a pi-network configuration. As described in Section 1, for binary-state phase shift networks, the loaded-line type network causes less insertion loss than a switched-line network.

The precise circuit implementation for the most significant and least significant Quits and the least significant bit is a design choice. The exemplary embodiment implements the 32 phase shift increments using eight parallel branched transmission line paths and a dual-state loaded line path in three phase shift networks —two Quits and one Bit, respectively. The transmission line segments are formed from microstrip transmission components and, for the larger phase differentials in the most significant Quit 10, series (high-pass) and shunt tuning capacitors. The precise specification for these elements is a matter of routine design selection, and need not be described in detail. The transmission line components are provided by sections of transmission line selected for characteristic path length and impedance. Two adjacent transmission line components having different characteristic impedances are sometimes used to achieve a particular impedance transformation. For the large-differential phase shifts produced by the branches of Quit 10, the tuning capacitors (both shunt and series) are selected to provide an appropriate reactance. Either monolithic or hybrid implementations may be used.

Implementing the Quit phase shift networks with parallel branched switched-line phase-increment branch circuits and the Bit phase shift network with a loaded-line phase-increment branch circuit is also a design choice. The Quits can be implemented with parallel loaded-lines, and the Bit can be implemented with a switch-line. Insertion loss considerations outlined in Section 1 provide the design methodology for selecting an appropriate implementation for a phase shift system using N-state phase shift networks in accordance with this invention.

In any phase shift system design, the significant design criteria will be phase resolution or error, together with specifications for VSWR, insertion loss and insertion loss variation. Generally, a phase shift system design attempts to minimize overall insertion loss of the phase shifter, insertion loss between phase shift networks and variations in insertion loss between phase increment branch circuits. In addition, VSWR interactions should be minimized.

As shown in FIG. 2, each phase shift element is proceeded by a respective DC voltage offset circuit 12, 22 and 32. Each DC voltage offset circuit includes a quarter-wave transmission line component (14, 24, 34) in series with DC voltage offset diode (15, 25, 35) and an RF bypass capacitor (16, 26, 36). The quarter-wave component creates an effective open circuit at the transmission path. The voltage offset diode provides a level shift that effectively isolates the control elements in the inactive phase-increment branch circuits of each phase shift network from control voltage ripple that could otherwise cause a (partial/complete) change in state. The RF bypass capacitor provides an RF short circuit for the DC voltage offset diode that reduces VSWR interactions.

In operation, the DC voltage offset diode (15, 25, 35) in each DC voltage offset circuit is always biased on because one phase-increment branch circuit is always active. The forward bias voltage drop (typically 1.5v) appears as a −1.5v DC offset at the external ports of the networks (i.e., Quits 10 and 20 and Bit 30, and outputs of Quits 10 and 20). Thus, for those control elements biased off (with zero volts on their respective control line, a 1.5 volt ripple on the control line can be tolerated without inadvertently forward biasing the control element.

Most significant Quit 10 is a switched-line parallel branched quaternary-state phase shift network that provides the four most significant phase states: Reference, +90°, −180° and −90° (i.e., dividing the most significant 360° phasor into four equal phase increments). Each phase-increment branch circuit includes one control element at either end of a transmission line segment, and an associated control line biasing circuit for the control elements. The phase shift increment effected by a transmission line segment is determined by distributed transmission line components, as well as shunt and series (high-pass) capacitive components.

Branch circuit 100 is the reference phase state branch for the most significant Quit 10. It includes PIN diode control elements D1A and D1B on either end of the transmission line segment TL1. The transmission line TL1 is formed by a series of transmission line components 112 and series tuning capacitor 114 on the RF path, together with two shunt capacitors 116.

The PIN diodes D1A and D1B are biased by a control line CL1A coupled through a control circuit 120, and a control line CL1B coupled through respective shunt diode control circuits 130 and 140, to the transmission line TL1. The shunt diode control circuits 130 and 140 are used on this reference branch (and on the −180° phase shift branch) to provide additional off-state (deactivated) isolation to minimize insertion loss and VSWR interactions for this circuit implementation.

Control line CL1A is connected through respective quarter-wave transmission line components to transmission line TL1 on either side of the high-pass capacitor 114 (which does not pass the DC bias voltages), with RF bypass being provided by respective capacitors 124 and 125. Control line CL1B is coupled through respective shunt diodes 132 and 142 to either end of the transmission line TL1, with RF bypass being provided by respective capacitors 134 and 144.

Branch circuit 200, which provides the +90° phase shift state, includes pin diodes D2A and D2B on either end of transmission line TL2. Transmission line TL2 is formed by series transmission line components 212 and dual series capacitors 214 and 215, together with a shunt transmission line element 216.

The PIN diodes are biased by a single control line CL2 coupled through a dual-path control circuit 220. Control line CL2 is coupled through respective quarter-wave transmission line components 222 and 223 to transmission line TL2 on either side of the series capacitors 214 and 215, with RF bypass being provided by capacitors 224 and 225.

Branch circuit 300, which provides the −180° phase state, includes PIN diodes D3A and D3B on either end of a transmission line TL3. Transmission line TL3 is formed by series transmission line components 312, together with shunt capacitors 314. The PIN diodes D3A and D3B of branch 300 are biased by a control line CL3A coupled through a control circuit 320, and a control line CL3B coupled through dual diode-shunt control circuits 330 and 340. Control line CL3A is connected through a quarter-wave transmission line element 322 to transmission line TL3, with RF bypass through a capacitor 324. Control line CL3B is connected through respective shunt diodes 332 and 342 to transmission line TLB, with RF bypass through respective capacitors 334 and 344. As in the case of the reference branch 100, shunt-diode isolation is provided for the −180° branch 300 to provide additional isolation to minimize insertion loss and VSWR interactions for this circuit implementation.

The fourth phase-increment branch circuit 400 of Quit 10, which provides the −90° phase shift increment, includes control diodes D4A and D4B at either end of transmission line TL4. Transmission line TL4 includes series transmission line elements 412 and shunt capacitors 414. The PIN diodes D4A and D4B are biased by control line CLA coupled through a control circuit 420. Control line CLA is connected through a quarter-wave transmission line component 422 to transmission line TL4, with RF bypass through a capacitor 424.

Using shunt diodes on the Reference and −180° (half-wavelength) branches, and not on any other branches, is a design choice. RF signal leakage through a deactivated branch circuit can be minimized by the selection of high quality control elements. Nevertheless because the half-wavelength branches are particularly susceptible to a standing wave condition, the additional isolation provided by the shunt diodes is recommended. Shunt diode isolation could be included on the other branches if the control elements do not provide adequate RF leakage control in the deactivated state. Also, using a Terit for the most significant phasor would eliminate the undesired half-wave and full-wave resonances.

In operation, the appropriate selection of bias voltages for control lines CL1A/CL1B, CL2, CL3A/CL3B and CL4 causes the RF signal input to the most significant Quit 10 to transmit through the RF path provided by one (and only one) of the parallel branch circuits 100, 200, 300 or 400, introducing a corresponding incremental phase shift (Reference, +90°, −180° or −90°). That is, the phase shift increment provided by the phase shift network quit 10 is selected by applying an activating bias voltage to either control lines CL1A and CL1B for the reference branch 100, CL2 for the +90° branch 200, CL3A and CL3B for the −180° branch 300 or CL4 for the −90° branch 400, with the other Phase increment branch circuits being deselected by applying a deactivating bias voltage to their respective control lines. The bias current for the PIN diode control elements D1A, D2A, D3A and D4A passes through DC voltage offset circuit 12 (diode 15), while the bias current for D1B, D2B, D3B and D4B passes through DC voltage offset circuit 22 (diode 25).

Reference branch 100 is activated by a negative bias voltage (such as −5 volts) applied to control line CL1A, with 0 volts being applied to control line CL1B. This control bias state turns on PIN diodes D1A and D1B, while turning off the shunt diodes 132 and 142, allowing the RF signal to transmit down transmission line TL1 with the corresponding phase shift. To deactivate reference branch 100, the bias voltages on the respective control lines are reversed, with a negative bias voltage on control line CL1B and 0 volts on control line CL1A. This control bias state turns off PIN diodes D1A and D1B, and at the same time turns on shunt diodes 132 and 142 to provide a shunt isolation path.

To activate the +90° branch circuit 200, a negative bias voltage is applied to control line CL2, turning on PIN diodes D2A and D2B, and allowing the RF signal to transmit down transmission line TL2. To deactivate the +90° branch, the control line CL2 is switched to 0 volts, turning off the PIN diodes D1A and D1B.

The −180° branch 300 is controlled analogously to the reference branch 100 (which also includes shunt-diode control). This branch is activated by applying a negative bias voltage to control line CL3A, and 0 volts to the shunt-diode control line CL3B, turning on the PIN diodes D3A and D3B and biasing the shunt diodes 332 and 342 off. The −180° branch is deactivated by reversing the bias voltages, to turn off PIN diodes D3A and D3B and turn on the shunt diodes 332 and 342.

The −90° branch circuit 400 is controlled analogously to the +90° branch 200 (which also does not include shunt diode control). This branch is activated with a negative bias voltage applied to control line CL4, turning on PIN diodes D4A and D4B, and is deactivated by switching the control line to 0 volts to turn off the PIN diodes.

The RF signal from most significant Quit 10 is coupled through the DC voltage offset circuit 22 to the least significant Quit 20. For each phase state of the most significant Quit 10 (i.e., reference, +90°, −180° and −90°), least significant Quit 20 is selectively switched to introduce four additional phase shift increments: Reference, −22.5°, −45° and −67.5° (i.e., dividing the next most significant 90° phasor into four phase increments).

Least significant Quit 20 is a parallel branched, switched-line phase shift element. Because of the more limited phase differential required for this Quit (i.e., a maximum of 67.5°), each branch of the phase shift element is implemented by distributed transmission line components without any lumped high-pass or shunt capacitors, and may be controlled without any shunt-diode isolation.

Reference branch 500 includes PIN diodes D5A and D5B at either end of a transmission line segment TL5. Transmission line TL5 comprises series transmission line components 512. The PIN diodes D5A and D5B are biased by a control line CLS coupled through a control circuit 520. Control line CL5 is connected through a quarter-wave transmission line component 522 to transmission line TL5, with RF bypass through a capacitor 524.

The other branches of Quit 20 are configured identically to the reference branch 500, except for respective variations in transmission line components to produce the different phase states. Thus, the −22.5° branch circuit 600 includes PIN diodes D6A and D6B at either end of a transmission line TL6, the −45° branch circuit 700 includes PIN diodes D7A and D7B at either end of a transmission line TL7, and the −67.5° branch circuit 800 includes PIN diodes D8A and D8B at either end of a transmission TL8. The PIN diodes for each branch are controlled by respective control lines CL6, CL7 and CL8 coupled through respective control circuits 620, 720 and 820 that include respective quarter-wave components and RF bypass capacitors.

In operation, a negative bias voltage on either of the control lines CL5, CL6, CL7 or CL8 (with 0 volts on the other control lines) turns on the corresponding PIN diode control elements to provide an single RF path over the respective transmission line segment. The bias current for PIN diode control elements D5A, D6A, D7A and D8A passes through DC voltage offset circuit 22 (diode 25), while the bias current for D5B, D6B, D7B, and D8B passes through DC voltage offset circuit 32 (diode 35).

The RF signal from least significant Quit 20 is coupled through DC voltage offset circuit 32 to least significant Bit 30, which provides the final 11.25° phase increment of the 32-phase-state phase shifter system. Least significant Bit 30 uses a loaded-line configuration formed by a pi-network that includes in its shunt legs impedance-control PIN diodes D9A and D9B.

The transmission line segment TL9 is formed by a transmission line component 912. The upstream shunt leg of the pi-network is formed by transmission line components 922 and 923 coupled through control diode D9A to ground and through a tuning capacitator 924 to ground and through a tuning capacitor 924 to ground. The downstream shunt leg is formed by transmission line components 932 and 933 coupled through PIN diode D9B to ground and through a tuning capacitor 924 to ground. The reactance of the shunt legs, and therefore the phase shift increment effected by the loaded-line least significant Bit 30, is determined by a control line CL9 that biases the PIN diodes D9A and D9B.

In operation, a negative bias voltage on control line CL9 turns on PIN diodes D9A and D9B, RF shorting tuning capacitors 924 and 934, removing their effective reactance and providing the 11.25° phase shift. Switching control line to zero volts, turns off PIN diodes D9A and D9B, effectively reinserting tuning capacitors 924 and 934 into respective shunt legs of the pi-network, allowing the input RE signal to transmit through transmission line TL9 with the reference phase shift.

An exemplary embodiment of a parallel branched N-state discrete increment signal processing system designed in accordance with this invention has been described in connection with a 32 phase-state phase shifter using a 2-Quit, 1-Bit phase shift network configuration. Those skilled in the art recognize that the N-state technique of this invention is readily adaptable to phase shifters using any number of phase increments and phase states.

3.0. Attenuator System. The parallel-branched N-state design method of this invention for discrete increment signal processing systems is readily adapted to the design of discrete increment attenuator systems. Using a parallel-branched N-state design for a discrete increment attenuator system is advantageous over binary state designs, providing attenuator systems with reduced complexity and insertion loss.

The general analysis set forth in Section 1 with respect to phase shift systems is equally applicable to attenuators. Thus, the N-state analysis set forth in Section 1 can be applied to attenuators by using the following variables:

$N_T$=Total number of attenuators states $\phi_i$=Attenuation increment of an attenuator network $A_i$=Attenuation range of an attenuator network $n_i$=Degree of attenuation $m_i$=Number of attenuator elements of similar degree Using these variables, the general expression for an attenuator system using cascaded parallel branched N-state attenuator networks is $$\phi_T = \frac{A_T}{\prod_{i=2}^{\infty} (n_i^{m_i})}$$

where $A_T$ is the total attenuation range (analogous to a phasor), and $\phi_T$ is the minimum required attenuation increment of the attenuator system.

In accordance with the parallel branched N-state design method of this invention, different combinations of parallel branched attenuator networks of mixed degrees can be used to achieve the same overall attenuation increment or attenuation resolution. The number of possible combinations increases significantly as the required attenuation increment becomes smaller.

The principle design factor to consider for parallel branched N-state attenuation systems is to minimize reference state (minimum attenuation state) insertion loss. Analogous to phase shift systems, reference state insertion loss and insertion phase variations are minimized by minimizing the number of cascaded parallel branched attenuator networks, the total number of attenuation increment branch circuits, and the total number of active control elements. In that regard, attenuators are generally designed for constant insertion phase with variable loss (in contrast to phase shift systems which are designed for constant loss with variable insertion phase). Thus, loaded-line circuits, which exhibit high phase variations between states, have less utility in attenuator systems than in phase shift systems.

In parallel branched N-state attenuator system design, the primary limitation on a parallel branched N-state, design for discrete increment attenuators systems is capacitive input and output loading by the parallel combination of all inactive (off-state) attenuator-increment branch circuits (i.e., control elements) of a network. As in the case of phase shift systems, once the effective capacitive loading of the control elements becomes significant, additional parallelization will not improve performance.

Figure 3:
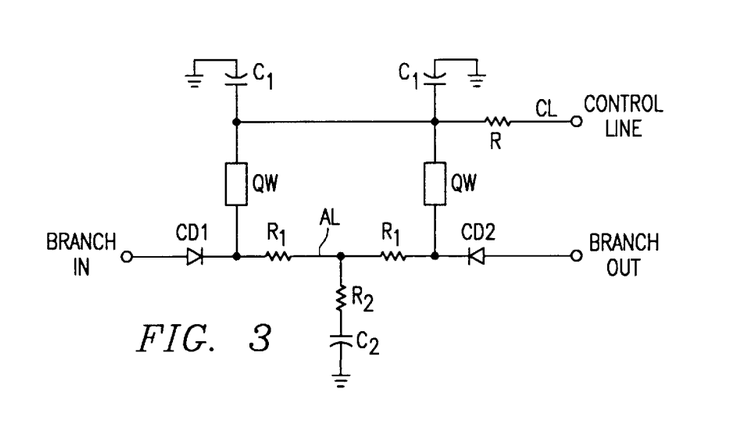
FIG. 3 is a circuit schematic diagram of an exemplary attenuator branch circuit for use in discrete increment attenuator networks.

FIG. 3 shows an exemplary attenuation-increment branch circuit that can be used for all attenuation increments, i.e., regardless of the attenuation state of the attenuator network.

The exemplary attenuator-increment branch circuit includes PIN control diodes CD1 and CD2 at the input and output ends of the branch circuit, on either end of an attenuation line AL. Attenuation line AL includes a resistive T-network with two resistors of equal value R1 connected in series on the signal path AL, and a shunt resistor R2 coupled to the attenuator line between the two series resistors. A capacitor C2 provides an RF path through R2, but blocks DC bias voltages.

The attenuation-increment branch circuit is controlled by a dual-path control circuit that couples the control line CL through respective quarter-wave transmission line components QW to the attenuator line AL adjacent respective control diodes CD1 and CD2, i.e., on either side of the series resistors R1. RF bypass for the control line CL is provided by respective capacitors C1. As in the case of the control circuits for the phase shift system, the quarter-wave transmission line components create an effective open circuit at the transmission path.

In operation, the attenuation-increment branch circuit is activated by applying a negative bias voltage (such as −5 volts) on control line CL. The negative bias voltage appears on the attenuator line AL, biasing the control diodes CD1 and CD2 on. To deactivate the branch circuit, the bias voltage on control line CL is switched to 0 volts, turning off the control diodes.

When the branch circuit is activated by a negative bias voltage on control line CL, an RF signal input transmits over the RF path provided by attenuation line AL, through the resistive attenuation network R1, R1 and R2. The amount of attenuation provided by the branch circuit is determined by the selection of the resistance values of resistor R1 (both instances) and R2.

The selection of the various components that comprise the attenuation-increment branch circuit is a design choice. As indicated, the resistance values of resistors R1 (both instances) and R2 of the resistor network are used to establish the amount of attenuation provided by the branch circuit, i.e., the attenuation increment. The specification for the quarter-wave transmission line components QW depends upon the wavelength of the input RF signal. PIN diodes are recommended by control diodes CD1 and CD2, although other active control elements (such as FET transistors) may be used. Either monolithic or hybrid implementations may be used.

In designing attenuator systems using cascaded parallel-branched N-state attenuator networks, providing a DC voltage offset circuit between networks is recommended. Specifically, the recommended implementation of DC voltage offset is that used in the exemplary phase shift system embodiment (circuits 12, 22 and 32 in FIG. 2) - Thus, a DC voltage offset diode is coupled through a quarter-wave transmission line component to the transmission line at the front end of each attenuator network, with RF bypass being provided through a shunt capacitor. Analogous to the DC voltage offset function in the exemplary phase shift system, the forward voltage drop across the DC voltage offset diode provides a negative voltage offset (typically −1.5 volts) on either end of each attenuation-increment branch circuit that provides a negative offset voltage to maintain the control diodes on the inactive (deselected) branch circuits biased off despite voltage ripple on the control line.

4. Conclusion. The parallel branched N-state design method of this invention provides flexibility in designing discrete increment signal processing systems (such as incremental phase shifters or attenuators). The design method implements discrete increment signal processing systems using cascaded parallel branched networks with N discrete increment branch circuits per network, without being limited to binary-state networks.

The design method first determines the minimum number of discrete increment states needed to implement a discrete increment signal processing application. For a given application, a number of alternative design implemetations are available in terms of total number of cascaded networks and total number of discrete increment branch circuits per network (in contrast to the binary-state approach that uses only two discrete increment processing states per network).

System design focuses on minimizing insertion loss and complexity, by minimizing the total number of cascaded networks, the total number of parallel branch circuits and the total number of branch control elements. Using N-state parallel branched networks provides the design flexibility to implement a discrete state signal processing system with reduced complexity and insertion loss (signal power attenuation) when compared to conventional binary-state systems.

Although the present invention has been described with respect to specific exemplary embodiments, various changes and modifications may be suggested to one skilled in the art, and it is intended that the present invention encompass such changes and modifications as fall within the scope of the appended claims.

What is claimed is:

1. A discrete increment attenuator for processing an input signal applied thereto by effecting discrete attenuation increments of the input signal to create corresponding attenuation states for an output signal resulting from said input signal, said attenuator comprising:

(a) a parallel branched attenuator providing at least three attenuation states defining corresponding attenuation increments, coupled to receive said input signal;

(b) a separate attenuation branch circuit having an input end and an output end for each said attenuation state of said parallel branched attenuator selectively activated by a unique attenuation state control signal for effecting a discrete incremental attenuation of said input signal;

(c) control circuitry for each attenuation branch circuit responsive to a control signal for selectively activating the associated attenuation branch circuit to effect the incremental attenuation including two active control elements, one said active control element on each end of each said attenuation branch circuit, said unique attenuation state control signal biasing said active control elements one of both on to activate said branch circuit and effect the corresponding attenuation or both off to deactivate said branch circuit;

(d) a respective resistance T-network coupled between said input end and said output end of each said attenuation branch circuit and an RF path which blocks DC bias voltages from said T-network to a source of reference voltage; and (e) a bias-off offset circuit coupled to said input for providing an offset biasing level to the respective two control elements for each inactive branch circuit to inhibit those circuits from activating in response to extraneous signals.

2. A discrete increment attenuator that processes an input signal by effecting discrete attenuation increments of said input signal to create corresponding attenuation states for an output signal, said attenuator comprising:

(a) at least one parallel branched attenuator with at least three attenuation states defining corresponding attenuation increments, coupled to receive the input signal;

(b) a separate attenuation branch circuit for each attenuation state corresponding to a particular said parallel branch selectively activated by a unique attenuation control signal for effecting a discrete incremental attenuation of the input signal;

(c) control circuitry for each attenuation branch circuit responsive to said unique attenuation control signal for selectively activating the associated attenuation branch circuit to effect the incremental attenuation;

(d) said control circuitry including on each of said attenuation branch circuits, two control elements, a respective said control element on either end of the associated attenuation branch circuit, said attenuation state control signal biasing said active control elements to be one of both on to activate said branch circuit and effect the corresponding attenuation or both off to deactivate said branch circuit, said control elements being diodes.

3. The attenuator of claim 2, further comprising a bias-off offset circuit connected to said input terminal for providing an offset biasing level to the respective two control elements for each inactive branch circuit to inhibit those circuits from activating in response to extraneous signals.

4. The attenuator of claim 3, further comprising:

at least two said parallel branched attenuators coupled in series;

said parallel branched attenuators each being responsive to at least one separate attenuation control signal to activate at least one selected attenuation branch circuit, each attenuation control signal defining a corresponding attenuation state, to create a selected combined attenuation state for the output signal.

5. The attenuator of claim 2, wherein, for each parallel branched attenuator network, only one attenuation branch circuit is active at one time, further comprising a bias-off offset circuit connected to said input terminal for providing an offset biasing level to the respective two control elements for each inactive branch circuit to inhibit those circuits from activating in response to extraneous signals.

6. The attenuator of claim 2, further comprising:

at least two said parallel branched attenuators coupled in series;

said parallel branched attenuators each being responsive to at least one separate attenuation control signal to activate at least one selected attenuation branch circuit, each attenuation control signal defining a corresponding attenuation state, to create a selected combined attenuation state for the output signal.

7. The attenuator system of claim 2, wherein, for each parallel branched attenuator only one attenuation branch circuit is active at a time.

8. The attenuator of claim 7, further comprising a bias-off offset circuit connected to said input terminal for providing an offset biasing level to the respective two control elements for each inactive branch circuit to inhibit those circuits from activating in response to extraneous signals.

9. The attenuator of claim 8, further comprising:

at least two said parallel branched attenuators coupled in series;

said parallel branched attenuators each being responsive to at least one separate attenuation control signal to activate at least one selected attenuation branch circuit, each attenuation control signal defining a corresponding attenuation state, to create a selected combined attenuation state for the output signal.

10. A discrete increment attenuator that processes an input signal by effecting discrete attenuation increments of said input signal to create corresponding attenuation states for an associated output signal, said attenuator comprising:

(a) at least one parallel branched attenuator having an input terminal and an output terminal, said attenuator having at least three attenuation states defining corresponding attenuation increments, coupled to receive the input signal at said input terminal;

(b) a separate attenuation branch circuit for each attenuation state corresponding to a particular said plural parallel branch selectively activated by a unique attenuation control signal for effecting a discrete incremental attenuation of the input signal;

(c) control circuitry for each attenuation branch circuit responsive to said unique attenuation control signal for selectively activating the associated attenuation branch circuit to effect the incremental attenuation;

(d) said control circuitry including on each of said attenuation branch circuits, two active control elements, a respective said active control element on either end of the associated attenuation branch circuit, said attenuation state control signal biasing said active control elements to be one of both on to activate said branch circuit and effect the corresponding attenuation or both off to deactivate said branch circuit; and (e) a bias-off offset circuit coupled to said input terminal for providing an offset biasing level to the respective two control elements for each inactive branch circuit to inhibit those circuits from activating in response to extraneous signals.

* * * * *